(12) United States Patent  
Yamashita et al.

(10) Patent No.: US 7,420,245 B2  
(45) Date of Patent: Sep. 2, 2008

(54) SEMICONDUCTOR DEVICE AND METHOD OF MANUFACTURING THE SAME

(75) Inventors: Atsuko Yamashita, Yokosuka (JP); Tetsuo Matsuda, Yokohama (JP); Hideki Okumura, Ibo-gun (JP); Masanobu Tsuchitani, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 487 days.

(21) Appl. No.: 11/194,609

(22) Filed: Aug. 2, 2005

(65) Prior Publication Data

US 2006/0043481 A1 Mar. 2, 2006

(30) Foreign Application Priority Data

Aug. 24, 2004 (JP) ............................. 2004-243613

(51) Int. Cl.  
*H01L 29/94* (2006.01)
(52) U.S. Cl. .................. 257/328; 257/302; 257/339
(58) Field of Classification Search ............... 257/328, 257/302, 339  
See application file for complete search history.

(56) References Cited

U.S. PATENT DOCUMENTS 6,475,864 B1 * 11/2002 Sato et al. .................... 438/268

6,611,021 B1 * 8/2003 Onishi et al. ................ 257/328  
6,888,195 B2    5/2005 Saito et al.  
2004/0238844 A1  12/2004 Tokano et al.

FOREIGN PATENT DOCUMENTS

JP    2001-119022    4/2001  
JP    2002-170955    6/2002

* cited by examiner

*Primary Examiner*—Long Pham  
(74) *Attorney, Agent, or Firm*—Oblon, Spivak, McClelland, Maier & Neustadt, P.C.

(57) ABSTRACT

A first semiconductor pillar layer of a first conductivity type is formed on a main surface of a semiconductor substrate of the first conductivity type. A second semiconductor pillar layer of a second conductivity type is formed adjacent to the first semiconductor pillar layer. A third semiconductor pillar layer of the first conductivity type is formed adjacent to the second semiconductor pillar layer. A semiconductor base layer of the second conductivity type is formed on the main surface of the second semiconductor pillar layer. An insulated-gate type semiconductor element is formed in the semiconductor base layer. The carrier concentration on the side of a main surface of each of said first through third semiconductor pillar layers is higher than a carrier concentration on the opposite side of said main surface in each of said first through third semiconductor pillar layers.

12 Claims, 13 Drawing Sheets n2＞n1、p2＞p1、L1≒L2

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application -No. 2004-243613, filed on Aug. 24, 2004, the entire content of which is incorporated herein by reference.

BACKGROUND OF THE INVENTION

1. Field of the Invention

The present invention relates to a semiconductor device and method of manufacturing the same.

2. Description of the Related Art

In a planar power MOS transistor in the art, a current path is identical to a breakdown voltage sustainable path. Therefore, a larger thickness of an epitaxial layer for achievement of a higher breakdown voltage results in an increased on-resistance. In contrast, a smaller thickness of the epitaxial layer for achievement of a lower on-resistance results in a reduced breakdown voltage. The presence of such the contradictory relation makes it difficult to satisfy both characteristics at the same time.

A recently proposed power MOS transistor called Super Junction structure has a current path separated from a breakdown voltage sustainable path. In this power MOS transistor, an n-type semiconductor pillar layer serving as the current path and a p-type semiconductor pillar layer serving as a current partition region are alternately arranged in the lateral direction. An n-type source region and a gate electrode are formed in and above a p-type semiconductor base layer formed on the upper surface of the p-type semiconductor pillar layer. (For example, see JP-A 2002-170955, pages 5-8, FIG. 3, and JP-A 2001-119022, pages 4-5, FIG. 1).

In this structure, the on-resistance depends on a carrier concentration in the n-type semiconductor pillar layer because a drain current flows in the n-type semiconductor pillar layer. On the other hand, the breakdown voltage depends on carrier concentrations and widths of the n-type and p-type semiconductor pillar layers because depletion layers extend in the lateral direction.

In the MOS power transistor disclosed in JP-A 2002-170955, an n-type silicon (Si) substrate is provided to form a thick n-type epitaxial Si layer thereon, and deep trenches are formed in the Si layer down to a depth reaching the Si substrate. Then, boron (B) as a p-type impurity and arsenic (As) as an n-type impurity having a smaller diffusion coefficient than that of B are implanted at the same time into sides of the trenches. A process of heating is then applied to diffuse B and As at the same time into a region sandwiched between the trenches. As a result, the region sandwiched between the trenches is provided with a p-type semiconductor pillar layer formed at the center and an n-type semiconductor pillar layer formed in the outer rim at the same time.

In the MOS power transistor disclosed in JP-A 2001-119022, the step of forming a thin n-type epitaxial Si layer on an n-type Si substrate and the step of implanting B as a p-type impurity into a certain location in the n-type epitaxial Si layer are employed. These steps are repeated alternately to form a thick semiconductor layer, followed by heating to diffuse B in the semiconductor layer. As a result, B-diffused regions are connected vertically with each other to form a p-type semiconductor pillar layer and non-B-diffused regions in the semiconductor layer are employed as an n-type semiconductor pillar layer.

In the MOS power transistor disclosed in JP-A 2002-170955 or JP-A 2001-119022, the upper and lower regions in the semiconductor pillar layer are determined equal in carrier concentration to achieve a lower on-resistance and a higher breakdown voltage at the same time.

If the upper and lower regions in the semiconductor pillar layer are equal in carrier concentration, however, the semiconductor pillar layer is given a narrow charge unbalance margin. Accordingly, if the carrier concentration and width of the semiconductor pillar layer cannot be obtained as designed, a problem may arise because the breakdown voltage of the power MOS transistor is reduced.

Particularly, when the width of the semiconductor pillar layer is made narrower and the carrier concentration is controlled higher to reduce the on-resistance per unit area in the power MOS transistor, the breakdown voltage of the power MOS transistor is reduced remarkably.

The charge unbalance margin herein means how much design tolerance on the carrier concentration and width of the semiconductor pillar layer may be allowed without reducing the breakdown voltage. Qn is herein defined as a pillar charge amount represented by a product of the carrier concentration by the width of the n-type semiconductor pillar layer, while Qp is defined as a pillar charge amount represented by a product of the carrier concentration by the width of the p-type semiconductor pillar layer. Then, the design tolerance is defined in relation to a deflection (Qn−Qp)/Qn from an ideal state in which Qn is equal to Qp so that complete depletion can be achieved.

In consideration of various variations at the process steps of manufacturing the power MOS transistor, the charge unbalance margin is desirably ±15% or more.

SUMMARY OF THE INVENTION

In one aspect the present invention provides a semiconductor device. It comprises a semiconductor substrate of a first conductivity type; a first semiconductor pillar layer of the first conductivity type formed on a main surface of the semiconductor substrate; a second semiconductor pillar layer of a second conductivity type formed adjacent to the first semiconductor pillar layer; a third semiconductor pillar layer of the first conductivity type formed adjacent to the second semiconductor pillar layer; and an insulated-gate type semiconductor element provided in a semiconductor base layer of the second conductivity type formed in a main surface of the second semiconductor pillar layer. Each of the first through third semiconductor pillar layers has a higher carrier concentration on the side of a main surface than a carrier concentration in each of the first through third semiconductor pillar layers on the opposite side to the main surface.

In one aspect the present invention provides a method of manufacturing a semiconductor device. The method comprises: forming respective lower regions of first through third semiconductor pillar layers on a main surface of a semiconductor substrate of a first conductivity type, the first through third semiconductor pillar layers including a first semiconductor pillar layer of the first conductivity type, a second semiconductor pillar layer of a second conductivity type adjacent to the first semiconductor pillar layer, and a third semiconductor pillar layer of the first conductivity type adjacent to the second semiconductor pillar layer; forming respective upper regions of the first through third semiconductor pillar layers on the respective lower regions of the first through third semiconductor pillar layers by stacking respective semiconductor pillar layers having the same conductivity types as and higher carrier concentrations than those of the first through third semiconductor pillar layers; and forming a semiconductor base layer of the second conductivity type in a main surface of the upper region of the second semiconductor pillar layer to form an insulated-gate field type semiconductor element in the semiconductor base layer.

DETAILED DESCRIPTION OF THE INVENTION

The embodiments of the present invention will now be described with reference to the drawings.

First Embodiment

Figure 1:
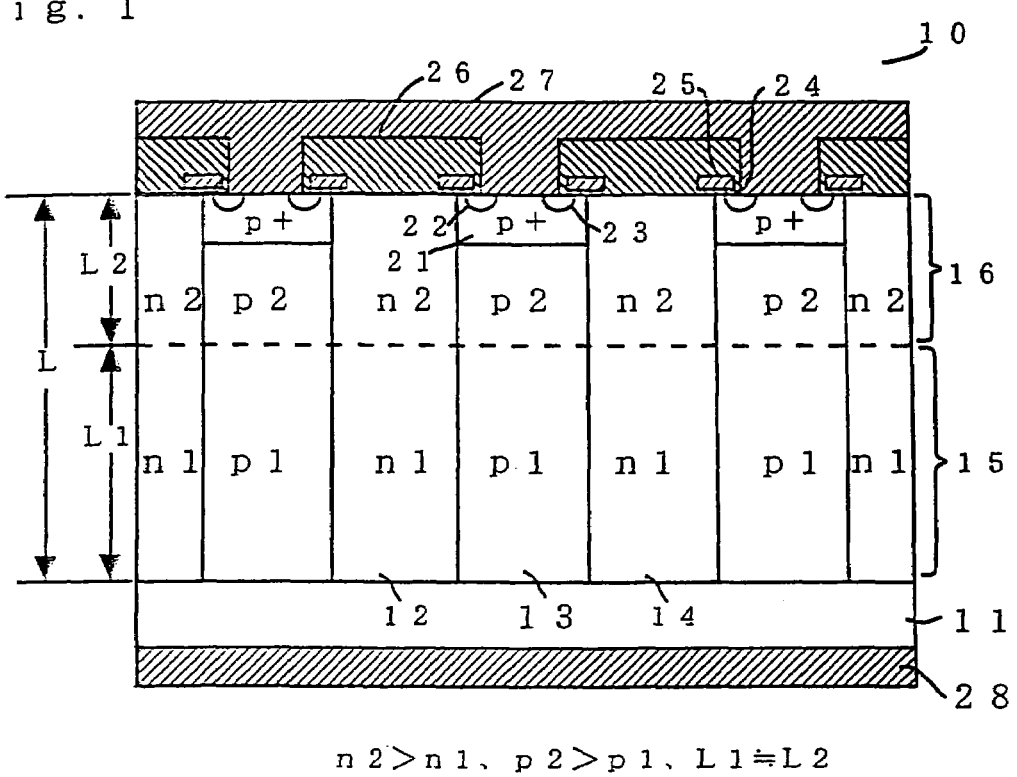
FIG. 1 is a cross-sectional view showing a structure of the major part of a semiconductor device provided with a power MOS transistor according to a first embodiment of the present invention.

A semiconductor device according to a first embodiment of the present invention is described with the use of FIGS. 1-3. FIG. 1 is a cross-sectional view showing a structure of the semiconductor device. FIG. 2 shows a carrier concentration distribution in a semiconductor pillar layer from a substrate. FIG. 3 schematically shows a relation between a charge unbalance margin and a carrier concentration distribution in the semiconductor pillar layer.

This embodiment is an example of the semiconductor device containing a power MOS transistor of approximately 900 V breakdown voltage and approximately 150 milliohm on-resistance.

In the semiconductor device 10 of the embodiment, an n-type first semiconductor pillar layer 12 having a length of L is formed on a main surface of the n-type semiconductor substrate 11 as shown in FIG. 1. A p-type second semiconductor pillar layer 13 is formed on the main surface adjacent to the n-type first semiconductor pillar layer 12, and an n-type third semiconductor pillar layer 14 adjacent to the p-type second semiconductor pillar layer 13.

The first through third semiconductor pillar layers 12-14 are divided into lower regions 15 having a length of L1 and a carrier concentration of n1, p1 and upper regions 16 having a length of L2 and a carrier concentration of n2, p2.

A p-type semiconductor base layer 21 is formed on the upper surface of the p-type second semiconductor pillar layer 13. A carrier concentration of said p-type semiconductor base layer 21 is designed to be higher than a carrier concentration p2 in a upper region 16 of the p-type second semiconductor pillar layer 13.

In the p-type second semiconductor base layer 21, an n-type first semiconductor source region 22 is formed close to the n-type first semiconductor pillar layer 12 and an n-type second semiconductor source region 23 is formed close to the n-type third semiconductor pillar layer 14.

A gate insulator 24 is formed on the p-type semiconductor base layer 21 between the n-type first semiconductor source region 22 and the n-type first semiconductor pillar layer 12 and between the n-type second semiconductor source region 23 and the n-type third semiconductor pillar layer 14. A gate electrode 25 is formed on the gate insulator 24.

An interlayer insulator 26 is formed to protect the surfaces of the first through third semiconductor pillar layers 12-14 and the gate electrode 25. A source electrode 27 is formed on the interlayer insulator 26.

The source electrode 27 is connected to the n-type first and second source regions 22 and 23 and the p-type semiconductor base layer 21 via apertures formed through the interlayer insulator 26. A drain electrode 28 is formed on a surface opposite to the main surface of the n-type Si substrate 11.

Figure 2A:
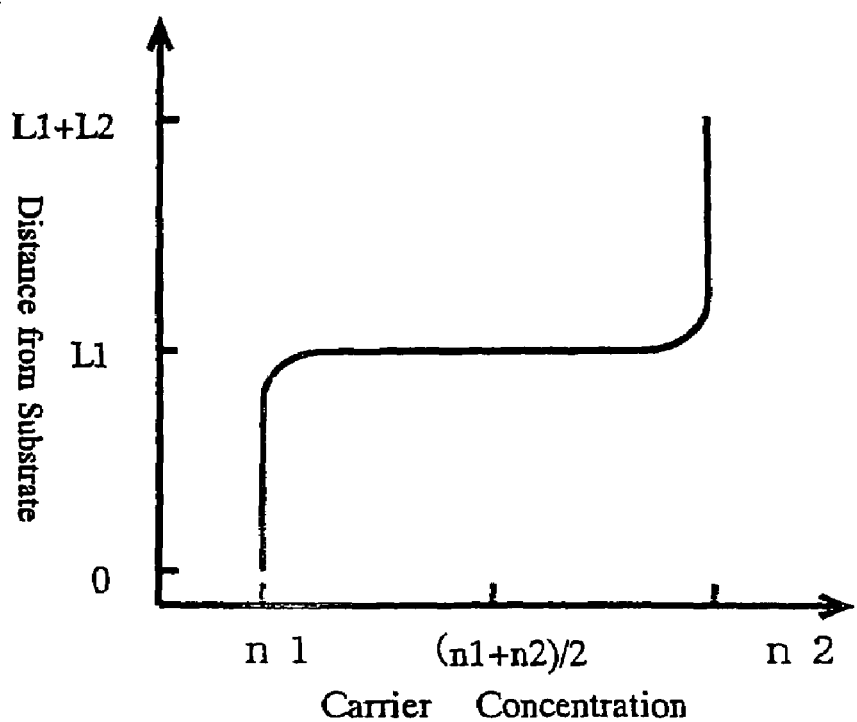
FIGS. 2A, 2B and 2C show carrier concentration distributions in a semiconductor pillar layer according to the first embodiment of the present invention.

As shown in FIG. 2A, the carrier concentration n2 in the upper regions 16 of the n-type first and third semiconductor pillar layers 12 and 14, for example, about 6E15 cm-3, is set higher than the carrier concentration n1 in the lower regions 15, for example, about 4E15 cm-3.

Figure 2B:
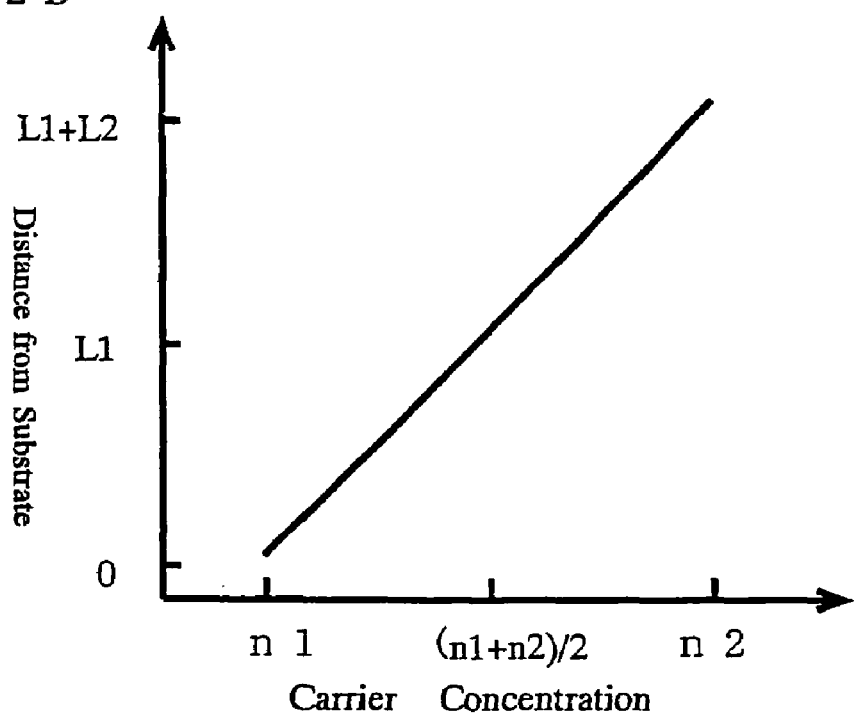
Figure 2C:
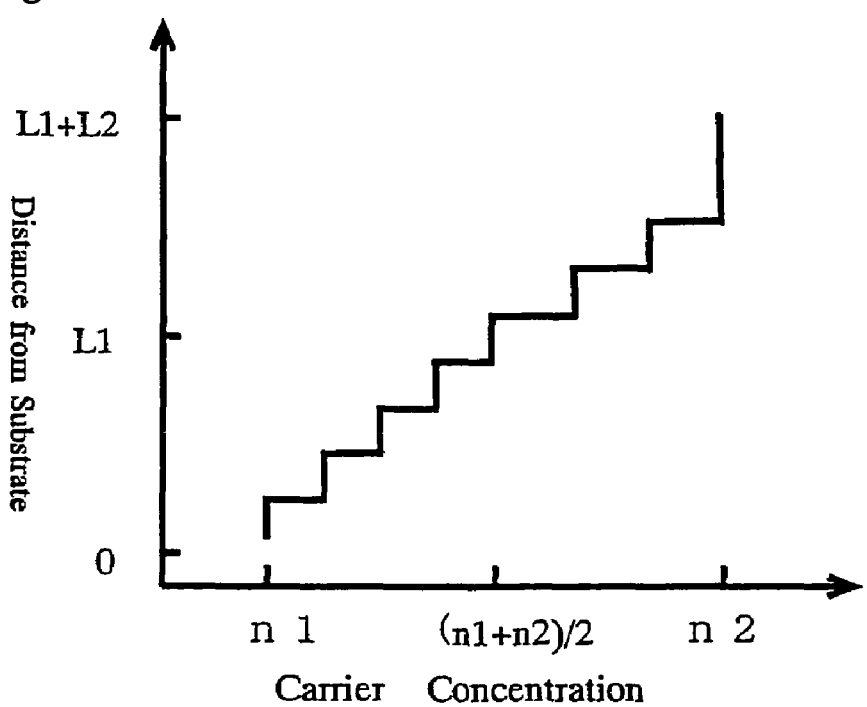

Similarly, the carrier concentration p2 in the upper region 16 of the p-type second semiconductor pillar layer 13 is set higher than the carrier concentration p1 in the lower region 15, where p1 and n1, as well as p2 and n2, are set almost equal to each other. Furthermore, a carrier concentration is substantially constant in each lower region 15 and upper region 16. Alternatively, as shown in FIGS. 2B and 2C, in each of the regions 15 and 16, carrier concentration may increase gradually (i.e., linear function-like, or step-like) toward the upper direction.

Next, the first through third semiconductor pillar layers 12-14 are described in detail about the carrier concentration distribution and the charge unbalance margin.

Figure 3A:
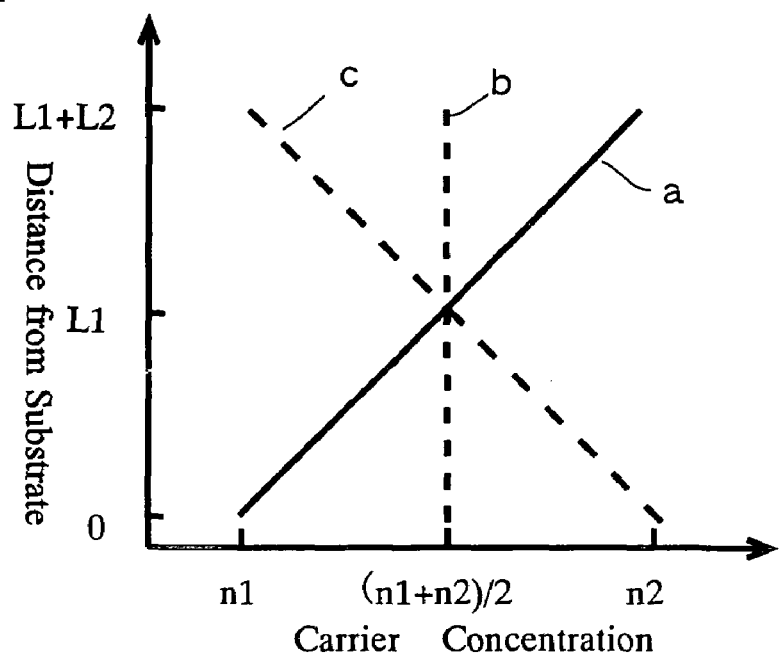
FIGS. 3A and 3B illustrate a relation between a charge unbalance margin and a carrier concentration distribution in the semiconductor pillar layer according to the first embodiment of the present invention.

FIG. 3A schematically shows carrier concentration distributions along the depth (distance from the substrate) in the p-type semiconductor pillar layer. The solid line a shows a carrier concentration distribution when the upper region is higher in carrier concentration than the lower region of the semiconductor pillar layer. The dashed line b shows a carrier concentration distribution when the upper region is similar in carrier concentration to the lower region of the semiconductor pillar layer. The dashed line c shows a carrier concentration distribution when the upper region is lower in carrier concentration than the lower region of the semiconductor pillar layer.

Figure 3B:
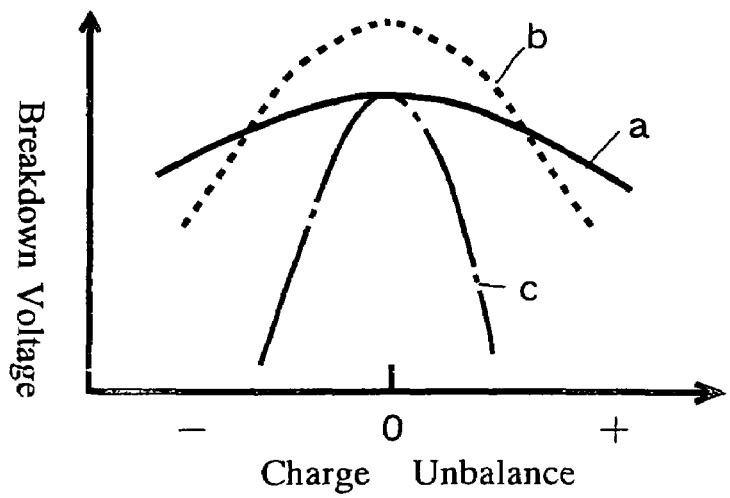

FIG. 3B schematically shows a relation between the amount of charge unbalance, $(Qn-Qp)/Qn$, and the drain breakdown voltage of the power MOS transistor. The solid line a shows a breakdown voltage distribution in the case of the carrier concentration distribution shown with the solid line a in FIG. 3A. The dashed line-b shows a breakdown voltage distribution in the case of the carrier concentration distribution shown with the dashed line b in FIG. 3A. The dashed line c shows a breakdown voltage distribution in the case of the carrier concentration distribution shown with the dashed line c in FIG. 3A.

In any one of the carrier concentration distributions a, b and c, the drain breakdown voltage can be maximized when the amount of charge unbalance, $(Qn-Qp)/Qn$, is reduced to zero, or complete depletion is achieved. As the amount of charge unbalance deflects from zero, the drain breakdown voltage lowers as shown in the breakdown voltage distributions a, b and c.

In the carrier concentration distribution a, the upper portion of the semiconductor pillar layer has a concentration closer to that in the p-type semiconductor base layer 21, compared to the conventional carrier concentration distribution b. Therefore, the breakdown voltage at each portion deteriorates little against a variation in the amount of charge unbalance. This is effective to suppress the reduction in drain breakdown voltage as a whole.

On the other hand, in the carrier concentration distribution c, the upper portion of the semiconductor pillar layer has a larger difference in concentration from the p-type semiconductor base layer 21, compared to the conventional carrier concentration distribution b. Therefore, the breakdown voltage at each portion deteriorates large. Thus, the drain breakdown voltage as a whole sharply lowers in response to a variation in the amount of charge unbalance.

Therefore, setting the carrier concentration in the upper portion of the semiconductor pillar layer higher than the carrier concentration in the lower portion can suppress the reduction in drain breakdown voltage at the time of complete depletion against fluctuation of the amount of charge unbalance. As a result, a sufficient charge unbalance margin can be obtained.

According to an experiment, it is appropriate that, relative to an average of the carrier concentrations in each of the first through third semiconductor pillar layers. 12-14, the carrier concentration in the upper region 16 of each of the first through third semiconductor pillar layers 12-14 is higher than 1-fold but not higher than 1.2-fold. In addition, it is appropriate that the carrier concentration in the lower region 15 of each of the first through third semiconductor pillar layers 12-14 is equal to or higher than 0.8-fold but lower than 1-fold. It is because a carrier concentration in the upper region 16 excessively higher than 1.2-fold or a carrier concentration in the lower region 15 excessively lower than 0.8-fold increases the difference in concentration along the depth as a whole. As a result, the drain breakdown voltage itself lowers at the time of charge balance. Thus, it is only allowed to obtain a low drain breakdown voltage.

In general, an on-resistance Ron is represented by $$Ron \propto (1/Nn) \times (Wn+Wp)/Wn$$

where Nn denotes an average carrier concentration in the n-type first semiconductor pillar layer 12, Wn denotes the width of the n-type first semiconductor pillar layer 12, and Wp denotes the width of the p-type second semiconductor pillar layer 13.

A narrow elongate pillar layer is advantageous to achieve a higher breakdown voltage and a lower on-resistance at the same time. Accordingly, in order to achieve a breakdown voltage of 900 V and an on-resistance of 150 milliohm, the first through third semiconductor pillar layers 12-14 have a length L of about 90 um, for example. In this case, the lower regions 15 of the semiconductor pillar layers have a length of about 60 um, and the upper regions 16 of the semiconductor pillar layers have a length of about 30 um, for example, preferably.

The widths Wn and Wp of the first through third semiconductor pillar layers 12-14 are preferably almost equal to each other and, for example, about 10 um. In a word, in order for depletion layers between the p-type semiconductor pillar layer 13 and the n-type semiconductor pillar layers 12 and 14 to be extended to achieve complete depletion to obtain a high breakdown voltage, it is possible to narrow the width Wn of the pillar layer and increase the carrier concentrations in the n-type semiconductor pillar layers 12 and 14, thus enabling the on-resistance to be reduced.

As descried above, in the semiconductor device according to the first embodiment of the present invention, the carrier concentrations in the upper regions 16 of the p-type and n-type semiconductor pillar layers are controlled higher than the carrier concentrations in the lower regions 15. Accordingly, a sufficient charge unbalance margin can be obtained without making a reduction in breakdown voltage.

Second Embodiment

A method of manufacturing a semiconductor device according to a second embodiment of the present invention is described next in detail. FIGS. 4-12 are cross-sectional views showing process steps of manufacturing the semiconductor device 10. These figures are cross-sectional views sequentially showing the steps of forming the semiconductor pillar layers having higher carrier concentrations in the upper regions than carrier concentrations in the lower regions.

Figure 4:
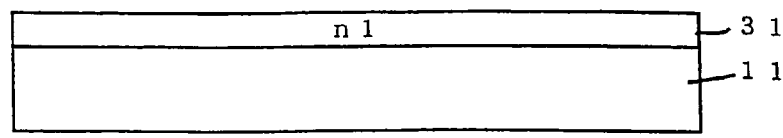
FIG. 4 is a cross-sectional view showing a process step of manufacturing a semiconductor device according to a second embodiment of the present invention.

As shown in FIG. 4, on the main surface of the n-type Si substrate 11 having a carrier concentration of, for example, about 1E18 cm-3, an n-type Si epitaxial layer 31 having a carrier concentration of n1, for example, about 4E15 cm-3, is grown about 5 um thick, for example.

Figure 5:
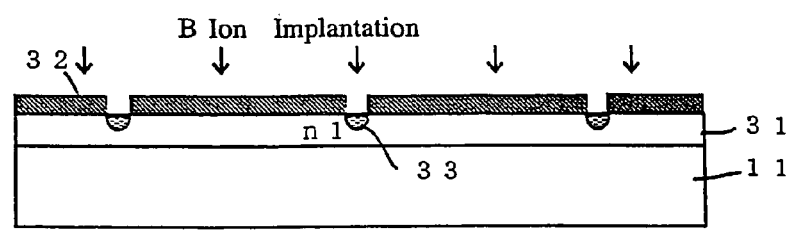
FIG. 5 is a cross-sectional view showing a process step of manufacturing the semiconductor device according to the second embodiment of the present invention.

Next, as shown in FIG. 5, a resist film 32 is formed on the Si epitaxial layer 31. Then, with a mask of the resist film 32, B is implanted into the surface of the Si epitaxial layer 31 to form first impurity-implanted regions 33. In this case, the carrier concentration p1 is controlled to reach about 4E15 cm-3 after heating. The first impurity-implanted regions 33 are formed at positions corresponding to the positions where the p-type second semiconductor pillar layers 13 are formed.

Figure 6:
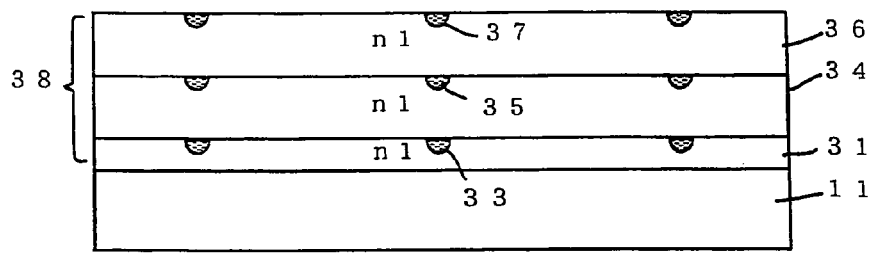
FIG. 6 is a cross-sectional view showing a process step of manufacturing the semiconductor device according to the second embodiment of the present invention.

Next, as shown in FIG. 6, the resist film 32 is removed. Then, an n-type Si epitaxial layer 34 having a carrier concentration of n1 is grown thicker than the Si epitaxial layer 31, for example, about 10 um. Thereafter, B is implanted into locations for use in formation of the p-type second semiconductor pillar layer 13 to form first impurity-implanted regions 35.

Similarly, an n-type Si epitaxial layer 36 is grown and first impurity-implanted regions 37 are then formed to additionally deposit the Si epitaxial layer. A required number of such the steps are repeated to form an n-type first semiconductor layer 38 having a certain thickness of, for example, about 60 um.

Note that if a carrier concentration distribution in the lower region 15 shall be constant, impurity concentration in the first impurity-implanted regions 33, 35, 37 are equal to one another. In contrast, as shown in FIG. 2C, if a carrier concentration in the lower region 15 shall be increased toward the upper direction, processes as follows may be performed. Namely, the impurity concentration in the first impurity-implanted regions 35 is set higher than that of the impurity-implanted regions 33, and the impurity concentration in the first impurity-implanted regions 37 is set higher than that of the impurity-implanted regions 35. Further, impurity concentrations in the epitaxial layers 31, 34, and 36 become higher toward the upper direction. If the repetition number of processes of growing an epitaxial layer (31, 34 and 36) and forming an impurity-implanted region (33, 35 and 37) is increased, a carrier concentration distribution as shown in FIG. 2B also may be obtained.

Figure 7:
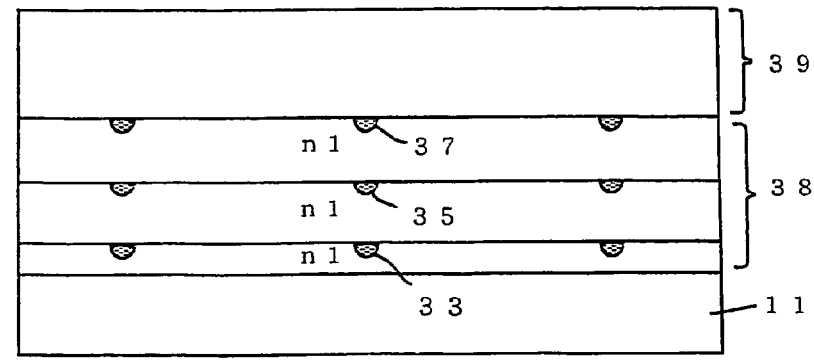
FIG. 7 is a cross-sectional view showing a process step of manufacturing the semiconductor device according to the second embodiment of the present invention.

Next, as shown in FIG. 7, on the first impurity-implanted layer 38, an n-type epitaxial layer is grown, for example, about 30 um thick to form a thick n-type second semiconductor pillar layer 39.

Figure 8:
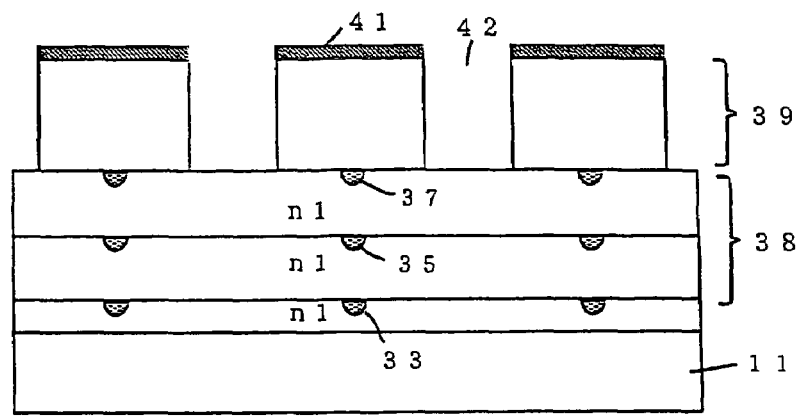
FIG. 8 is a cross-sectional view showing a process step of manufacturing the semiconductor device according to the second embodiment of the present invention.

Next, as shown in FIG. 8, a process of photolithography is applied to form a resist film 41. Then, with a mask of the resist film 41, a RIE (Reactive Ion Etching) is employed to open deep trenches 42 in the n-type second semiconductor layer 39 down to a depth reaching the n-type first semiconductor layer 38. The trenches 42 have a depth almost equal to the thickness of the n-type second semiconductor layer 39, a width of, for example, about 5 um, and a pitch approximately equal to the pitch of the p-type impurity-implanted regions 37. The trenches 42 are formed so that the p-type first impurity-implanted regions 37 are positioned in approximately intermediate positions between the trenches 42 adjacent in the horizontal direction.

Figure 9:
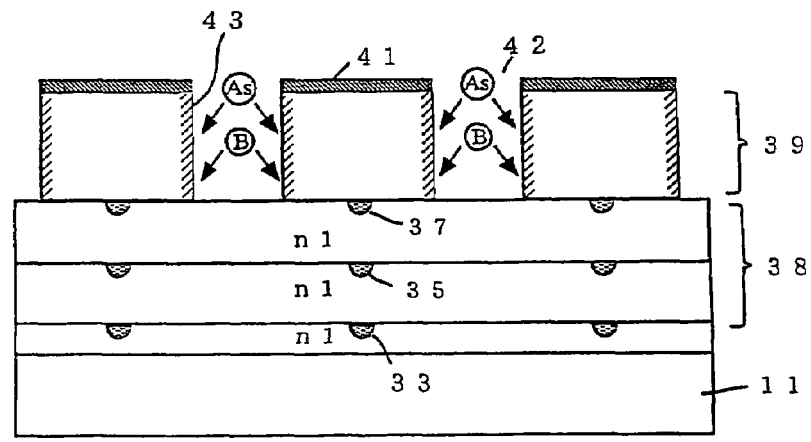
FIG. 9 is a cross-sectional view showing a process step of manufacturing the semiconductor device according to the second embodiment of the present invention.

Next, as shown in FIG. 9, a process of rotational ion implantation is applied with a mask of the resist film 41 to implant As and B at an implantation angle of 5-7° into sides of the trenches 42 to form second impurity-implanted regions 43. In this case, the carrier concentrations n2 and p2 are both controlled to reach about 6E15 cm-3, for example, after heating.

If the implantation angle in the rotational ion implantation method is constant during the process, a carrier concentration distribution in the upper region 16 may be uniform.

In contrast, if the implantation angle in the rotational ion implantation method increases gradually, a carrier concentration in the upper region 16 may increase toward the upper direction, as shown in FIGS. 2B and 2C.

Figure 10:
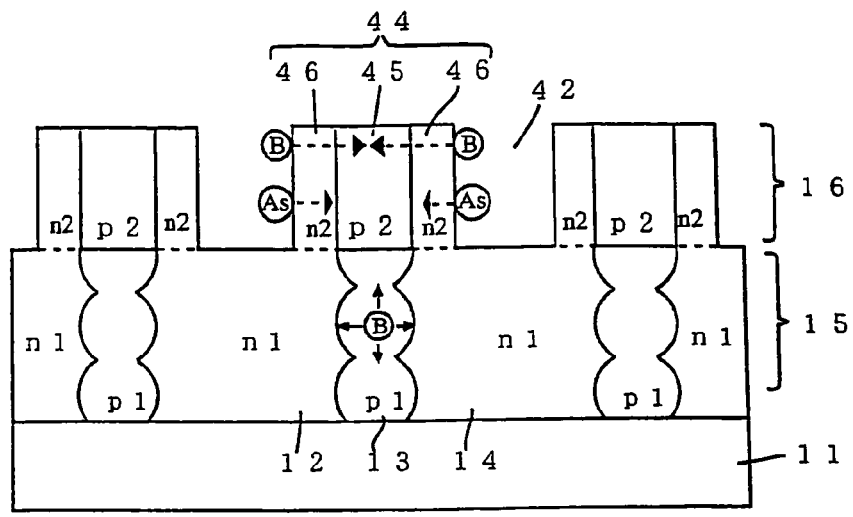
FIG. 10 is a cross-sectional view showing a process step of manufacturing the semiconductor device according to the second embodiment of the present invention.

Next, as shown in FIG. 10, heating of approximately 1140° C. ×24 hours is performed to diffuse B from the first impurity-implanted regions 33, 35 and 37 into the n-type first semiconductor layer 38. This heating also diffuses B and As from the second impurity-implanted region 43 into an impurity-diffused region 44 sandwiched between the trenches 42 at the same time.

Thus, the regions that contain B diffused from the first impurity-implanted regions 33, 35 and 37 are connected vertically with each other to form the lower region 15 of the p-type first semiconductor pillar layer 13. At the same time, the lower regions 15 of the n-type first and third semiconductor pillar layers 12 and 14 are formed sandwiching the lower region 15 of the p-type first semiconductor pillar layer 13 therebetween.

At the same time, B can diffuse deeper than As diffuses because B is one-digit larger in diffusion coefficient than As. Accordingly, the left and right B-diffused regions are connected to form a p-type diffused region 45 at the center of the impurity-diffused region 44 sandwiched between the trenches 42. In addition, an n-type As-diffused region 46 is formed around the p-type diffused region 45 in a self-aligned manner.

As a result, the p-type diffused region 45 is connected vertically to the lower region 15 of the p-type second semiconductor pillar layer 13 to form the p-type second semiconductor pillar layer 13. At the same time, the n-type diffused region 46 is connected vertically to the lower regions 15 of the n-type first and third semiconductor pillar layers 12 and 14 to form the n-type first and third semiconductor pillar layers 12 and 14.

Thus, it is possible to form the n-type first through third semiconductor pillar layers 12-14 in which the upper regions 16 are higher in carrier concentration than the lower regions 15.

Figure 11:
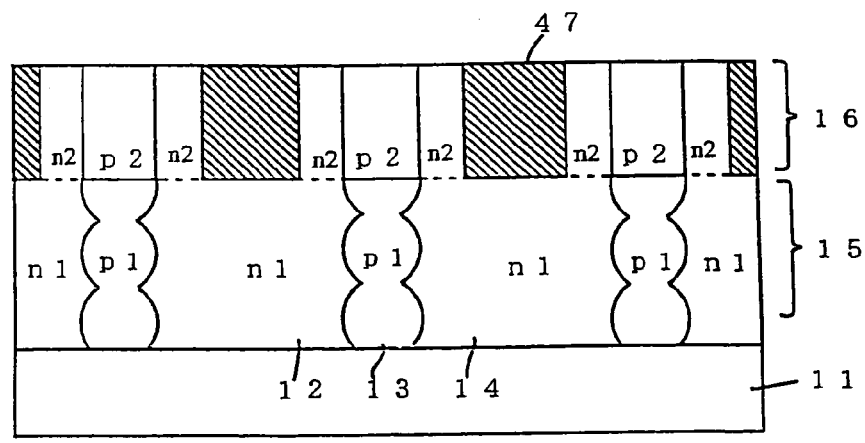
FIG. 11 is a cross-sectional view showing a process step of manufacturing the semiconductor device according to the second embodiment of the present invention.

Next, as shown in FIG. 11, an insulator 47 is formed over the entire surface to fill the trenches 42 therewith. Then, a CMP (Chemical Mechanical Polishing) is applied to planarize the surface and remove undesired portions of the insulator 47 outside the trenches 42.

The insulator 47 is formed through a process of thermal oxidation to form a silicon oxide film on sides of the trenches 42 and a process of CVD (Chemical Vapor Deposition) to deposit a silicon oxide film or a silicon nitride film over the entire surface.

Figure 12:
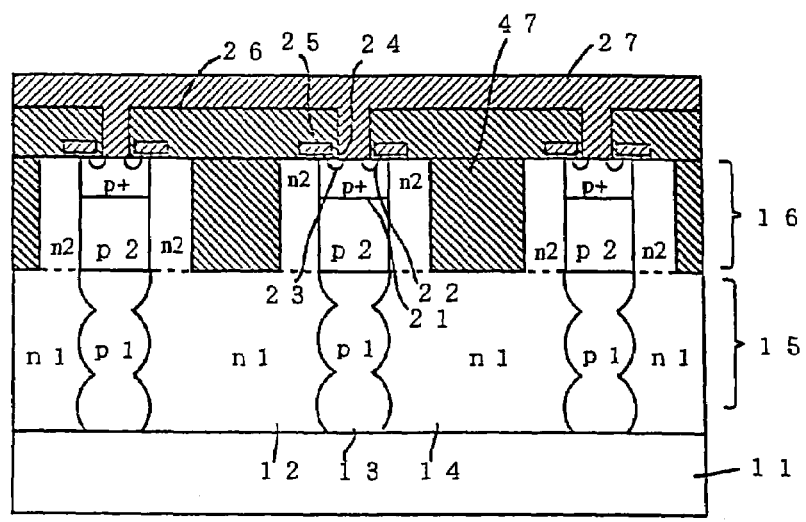
FIG. 12 is a cross-sectional view showing a process step of manufacturing the semiconductor device according to the second embodiment of the present invention.

Next, as shown in FIG. 12, in accordance with well-known process steps of manufacturing power MOS transistors, the p-type semiconductor base layer 21 is formed on the p-type semiconductor pillar layer 13. Thereafter, the n-type first and second semiconductor source regions 22 and 23 are formed selectively in the upper surface of the p-type semiconductor base layer 21.

Next, the gate insulator 24, the gate electrode 25, the interlayer insulator 26, the source electrode 27 and the drain electrode 28 are formed to complete the semiconductor device 10. This semiconductor device 10 includes the narrow elongate semiconductor pillar layers 12-14 in which the upper regions 16 are higher in carrier concentration than the lower regions 15.

The method of manufacturing a semiconductor device according to the second embodiment of the present invention is described above. In accordance with the method, the p-type and n-type semiconductor pillar layers formed in the epitaxial layer are connected vertically to the p-type and n-type semiconductor pillar layers formed in the region sandwiched between the trenches to form the elongated pillar layers. Therefore, it is possible to form narrow elongate semiconductor pillar layers and obtain a reduced on-resistance with a fine width.

In addition, in comparison with repetition of a required number of formation of the epitaxial layer and implantation of impurity ions, the method of implanting impurity ions into sides of the trenches can realize the narrow elongate pillar layers easier even if the carrier concentrations are higher. Therefore, this method is extremely effective to form narrow elongate semiconductor pillar layers with higher carrier concentrations in the upper regions.

Accordingly, it is possible to provide a semiconductor device equipped with a power MOS transistor having a sufficient breakdown voltage and a high reliability.

Third Embodiment

FIGS. 13-16 are cross-sectional views showing process steps of manufacturing a semiconductor device including a power MOS transistor according to a third embodiment of the present invention. These figures are cross-sectional views sequentially showing the steps of forming narrow elongate semiconductor pillar layers having carrier concentrations in the upper regions higher than carrier concentrations in the lower regions.

The same elements in this embodiment as those in the first embodiment are given the same reference numerals to avoid the duplicate description thereof, and only the difference is described.

This embodiment differs from the second embodiment in a p-type semiconductor layer buried in trenches to form the upper region of the p-type semiconductor pillar layer.

In accordance with the steps shown in FIGS. 4-7, the n-type first semiconductor layer 38 having a carrier concentration of n1 and the n-type second semiconductor layer 39 having a carrier concentration of n2 are epitaxial grown on the main surface of the n-type semiconductor substrate 11. The first impurity-implanted regions 33, 35 and 37 are formed in the n-type first semiconductor layer 38.

Figure 13:
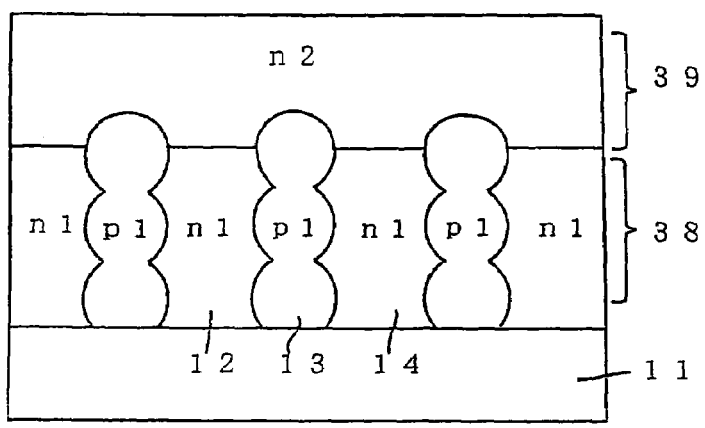
FIG. 13 is a cross-sectional view showing a process step of manufacturing a semiconductor device according to a third embodiment of the present invention.

Next, as shown in FIG. 13, heating of approximately 1140° C. ×24 hours is performed to diffuse B from the first impurity-implanted regions 33, 35 and 37 into the n-type first semiconductor layer 38.

Thus, the regions that contain B diffused from the first impurity-implanted regions 33, 35 and 37 are connected vertically with each other to form the lower region 15 of the p-type second semiconductor pillar layer 13. At the same time, the lower regions 15 of the n-type first and third semiconductor pillar layers 12 and 14 are formed sandwiching the lower region 15 of the p-type second semiconductor pillar layer 13 therebetween. Note that also in this embodiment, if a carrier concentration distribution in the lower region 15 shall be constant, impurity concentration in the first impurity-implanted regions 33, 35, 37 are equal to one another. In contrast, as shown in FIG. 2C, if a carrier concentration in the lower region 15 shall be increased stepwise toward the upper direction, processes as follows may be performed. Namely, the impurity concentration in the first impurity-implanted regions 35 is set higher than that of the impurity-implanted regions 33, and the impurity concentration in the first impurity-implanted regions 37 is set higher than that of the impurity-implanted regions 35. Further, impurity concentrations in the epitaxial layers 31, 34, and 36 become higher toward the upper direction. If the repetition number of processes of growing an epitaxial layer (31, 34 and 36) and forming an impurity-implanted region (33, 35 and 37) is increased, a carrier concentration distribution as shown in FIG. 2B also may be obtained.

Figure 14:
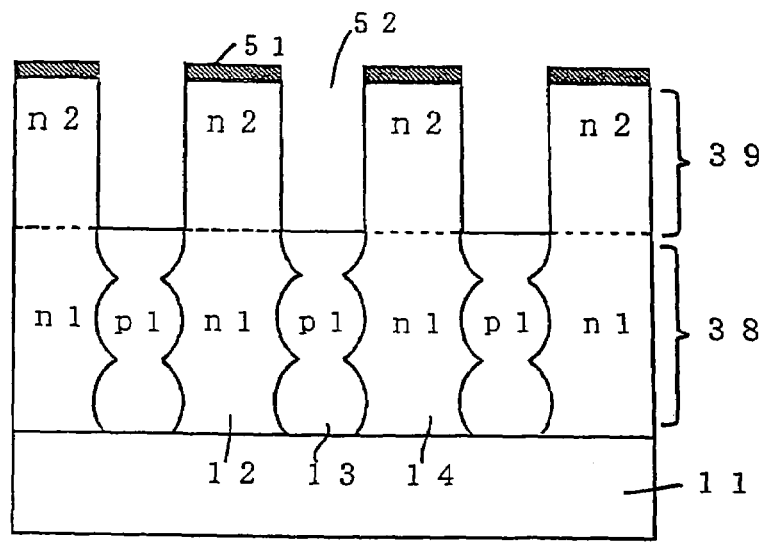
FIG. 14 is a cross-sectional view showing a process step of manufacturing the semiconductor device according to the third embodiment of the present invention.

Next, as shown in FIG. 14, a process of photolithography is applied to form a resist film 51. Then, with a mask of the resist film 51, a RIE (Reactive Ion Etching) is employed to open deep trenches 52 in the n-type second semiconductor layer 39 down to a depth reaching the n-type first semiconductor layer 38. The trenches 52 have a depth almost equal to the thickness of the n-type second semiconductor layer 39, a width almost equal to the width of the p-type second semiconductor pillar layer 13. The trenches 52 are formed above the positions where the p-type second semiconductor pillar layers 13 are formed.

Figure 15:
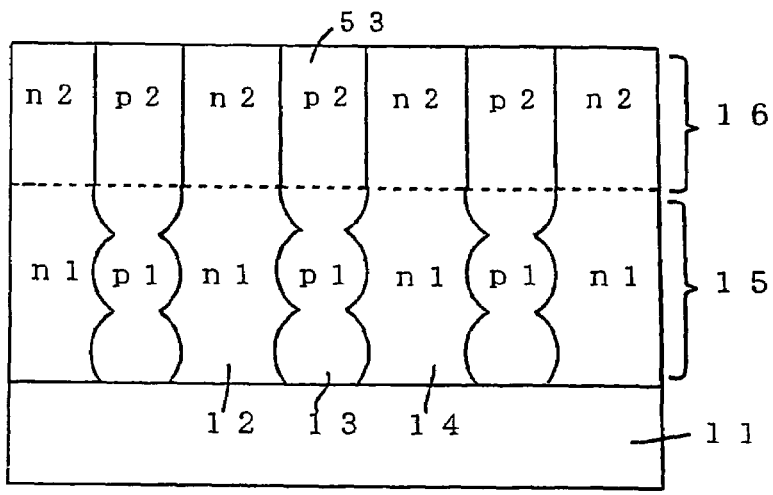
FIG. 15 is a cross-sectional view showing a process step of manufacturing the semiconductor device according to the third embodiment of the present invention.

Next, as shown in FIG. 15, a p-type Si epitaxial layer 53 having a carrier concentration of p2 is selectively formed in the trenches 52. Then, a CMP is applied to planarize the surface and remove undesired portions of the p-type Si epitaxial layer 53 outside the trenches 52. Thus, the p-type Si epitaxial layer 53 is buried in the trenches 52.

As a result, the lower region 15 of the p-type second semiconductor pillar layer 13 is connected vertically to the p-type Si epitaxial layer 53 to form the p-type second semiconductor pillar layer 13. At the same time, the lower regions 15 of the n-type first and third semiconductor pillar layers 12 and 14 are connected vertically to the n-type second semiconductor layer 39 to form the n-type first and third semiconductor pillar layers 12 and 14.

Thus, it is possible to form the n-type first through third semiconductor pillar layers 12-14 in which the upper regions 16 are higher in carrier concentration than the lower regions 15.

In this third embodiment, the upper region 16 is formed by burying a semiconductor layer in a trench. Therefore, a length L2 of the upper region 16 may be larger compared to cases using a rotational ion implantation method as the second embodiment. If the length L2 of the upper region 16 may be larger, the length L1 of the lower region 15 may be shorter instead, lessening a repetition number of processes of growing an epitaxial layer (31, 34 and 36) and forming an impurity-implanted region (33, 35 and 37).

Figure 16:
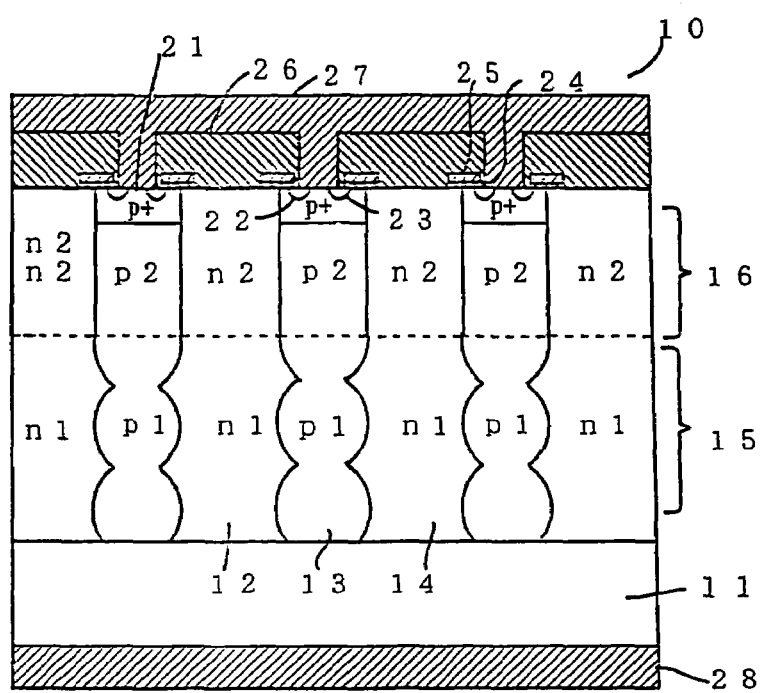
FIG. 16 is a cross-sectional view showing a process step of manufacturing the semiconductor device according to the third embodiment of the present invention.

Next, as shown in FIG. 16, in accordance with well-known process steps of manufacturing power MOS transistors, the semiconductor device 10 is completed including the narrow elongate semiconductor pillar layers 12-14 in which the upper regions 16 are higher in carrier concentration than the lower regions 15.

Note that if the carrier concentration of the upper region 16 shall be set as to become higher toward the upper direction as shown FIGS. 2B and 2C, the epitaxial layer 39 and 53 can be formed to gradually increase the amount of impurity as the epitaxial growth goes on.

The method of manufacturing a semiconductor device according to the third embodiment of the present invention is described above. In comparison with repetition of a required number of formation of the epitaxial layer and implantation of impurity ions, the method of burying the semiconductor layer in the trenches can realize narrow elongate pillar layers easier even if the carrier concentrations are higher. This method is extremely effective to form narrow elongate semiconductor pillar layers with higher carrier concentrations in the upper regions. In addition, the insulator 47 is not required formed in the n-type second semiconductor layer 39. This is advantageous to downsize the chip.

Fourth Embodiment

A method of manufacturing a semiconductor device according to a fourth embodiment of the present invention is described next in detail. This fourth embodiment is different from the second or third embodiments in that both upper and lower regions are formed by burying a semiconductor layer in trenches. The method of manufacturing of the fourth embodiment is described with reference to FIG. 17 to FIG. 21 in the order of manufacturing.

Figure 17:
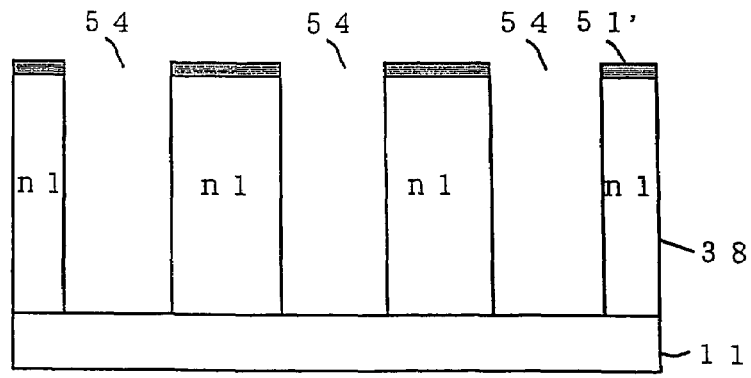
FIG. 17 is a cross-sectional view showing a process step of manufacturing a semiconductor device according to the fourth embodiment of the present invention.

First, as shown in FIG. 17, an n-type first semiconductor layer 38 as the lower region is epitaxially grown on the main surface of n-type Si substrate 11. On this n-type first semiconductor layer 38, a resist film 51' is formed by a photolithography method. Then, deep trenches 54 are formed in the n-type first semiconductor layer 38 by RIE using the resist film 51' as a mask.

Figure 18:
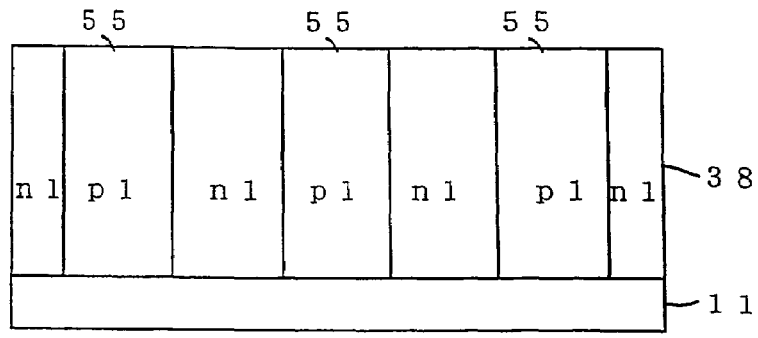
FIG. 18 is a cross-sectional view showing a process step of manufacturing the semiconductor device according to the fourth embodiment of the present invention.

Subsequently, as shown in FIG. 18, a p-type epitaxial layer 55 having a carrier concentration p1 is selectively formed in these trenches 54. Thereafter, it is planarized by CMP to form the lower regions of the first through third semiconductor pillar layer 12-14.

Figure 19:
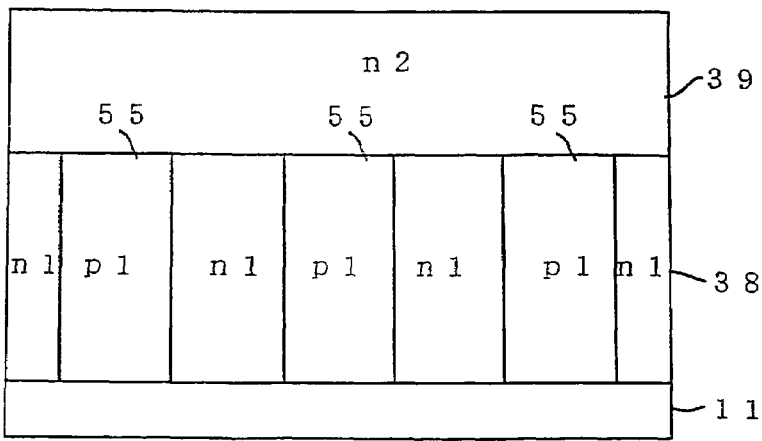
FIG. 19 is a cross-sectional view showing a process step of manufacturing the semiconductor device according to the fourth embodiment of the present invention.
Figure 20:
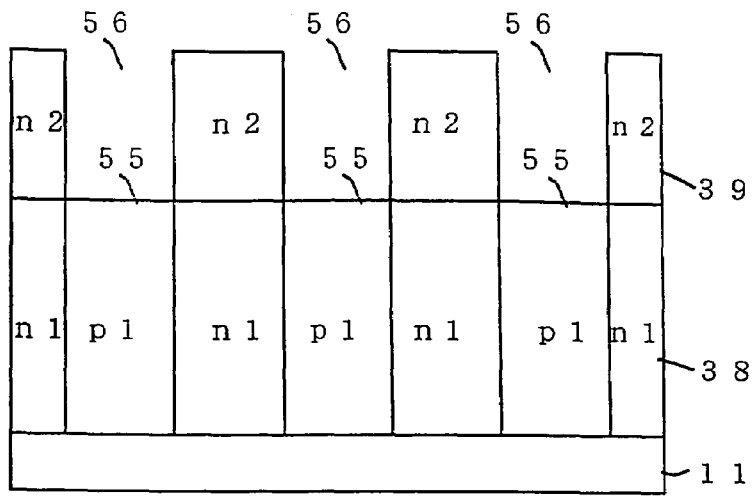
FIG. 20 is a cross-sectional view showing a process step of manufacturing the semiconductor device according to the fourth embodiment of the present invention.
Figure 21:
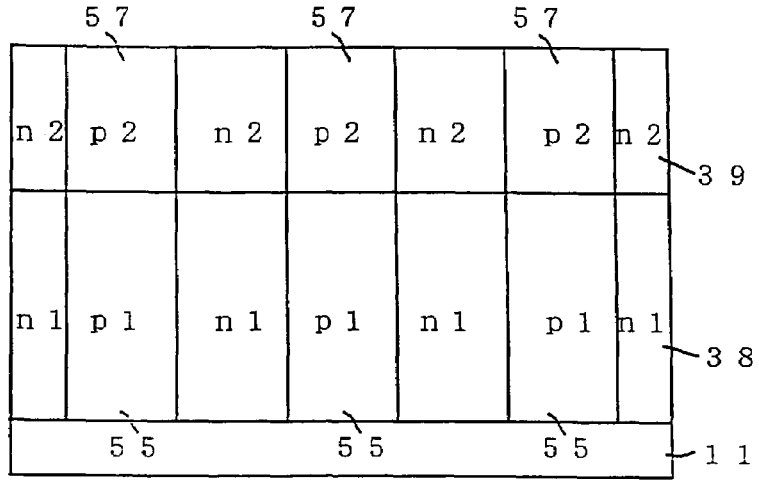
FIG. 21 is a cross-sectional view showing a process step of manufacturing a semiconductor device according to the fourth embodiment of the present invention.

Next, as shown in FIG. 19, n-type second epitaxial layer 39 having higher carrier concentration n2 (>n1) than that of n-type first semiconductor layer 38, is epitaxially grown on the lower region. Thereafter, as shown in FIG. 20, deep trenches 56 are formed in the n-type second semiconductor layer 39 by a photolithography method and RIE, so that they are aligned to the p-type epitaxial layers 55. Then, as shown in FIG. 21, a p-type epitaxial layer 57 having higher carrier concentration p2 (>p1) than that of p-type epitaxial layer 55, is epitaxially grown in these trenches 56. Thereafter, it is planarized by CMP, whereby the upper region of the first to third semiconductor pillar layer 12 to 14 are formed.

With the method of manufacturing a semiconductor device according to the fourth embodiment, it is easy to realize narrow elongate pillar layers even if the carrier concentrations are high, compared to repetition of a required number of formation of the epitaxial layer and implantation of impurity ions. Thus, this method is also extremely effective to form narrow elongate semiconductor pillar layers with higher carrier concentrations in the upper regions.

Fifth Embodiment

Figure 22:
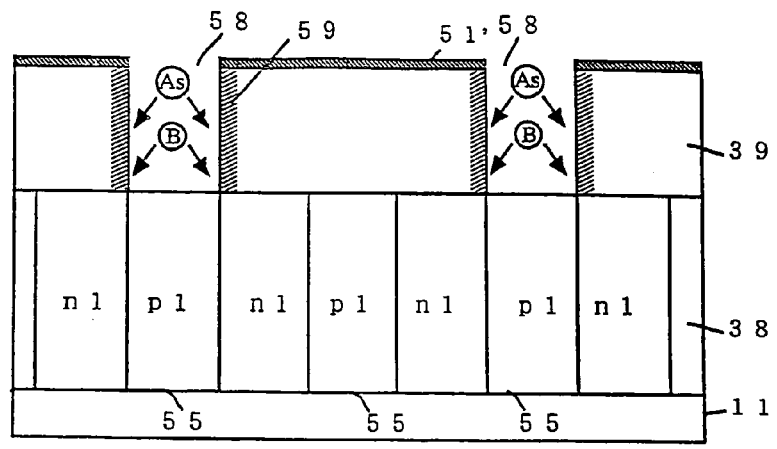
FIG. 22 is a cross-sectional view showing a process step of manufacturing a semiconductor device according to the fifth embodiment of the present invention.
Figure 23:
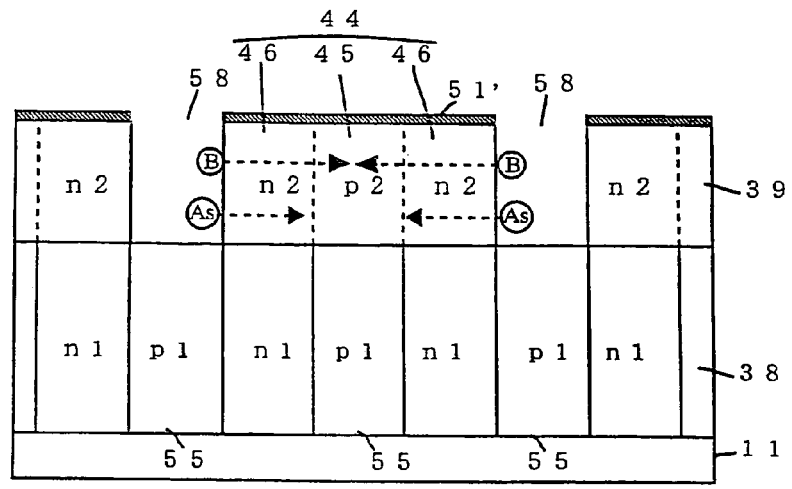
FIG. 23 is a cross-sectional view showing a process step of manufacturing the semiconductor device according to the fifth embodiment of the present invention.
Figure 24:
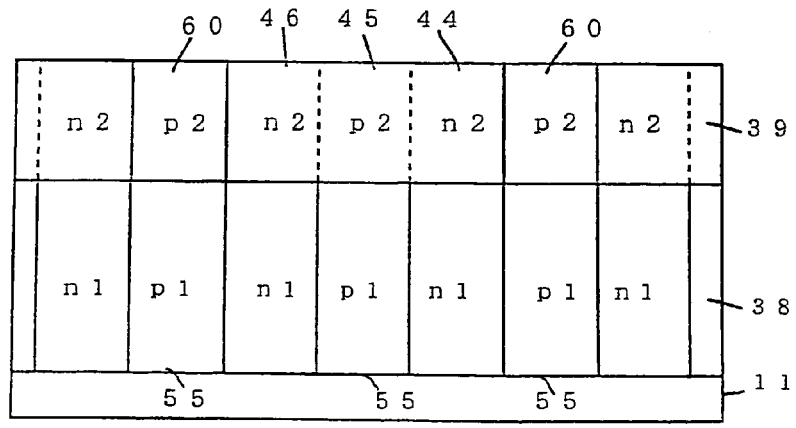
FIG. 24 is a cross-sectional view showing a process step of manufacturing the semiconductor device according to the fifth embodiment of the present invention.

A method of manufacturing a semiconductor device according to a fifth embodiment of the present invention is described next in detail. As shown in FIGS. 22 to 24, this fifth embodiment is same as the fourth embodiment in that the lower regions are formed by burying semiconductor layers in trenches. It is different from fourth embodiment, however, in that the upper regions are formed by rotational ion implantation method. The manufacturing method of the fifth embodiment is explained in the order of manufacturing.

First, similar to the fourth embodiment, after forming the lower region in the processes as explained in FIGS. 17 and 18, n-type second semiconductor layer 39 is epitaxially grown on the lower regions. Subsequently, as shown in FIG. 22, trenches 58 are formed in the n-type second semiconductor layer 39 by photolithography and RIE, so as to have a depth nearly equal to the thickness of n-type second semiconductor layer 39, using the resist film 51' as a mask. One of the trenches 58 is formed on every two p-type epitaxial layer 55.

Next, a process of rotational ion implantation is applied with a mask of the resist film 51' to implant As and B at an implantation angle of 5-7° into sides of the trenches 58 to form impurity-implanted regions 59, so that the carrier concentration will be n2 and p2 (n2>n1, p2>p1) after heating.

Next, as shown in FIG. 23, heating of approximately 1140° C. ×24 hours is performed to diffuse B and As from the impurity-implanted region 59 into an impurity-diffused region 44 at the same time. Thereby, p-type diffusion regions 45 are formed in the center of impurity-diffused regions 44. Additionally, As-diffused n-type diffusion regions 46 are formed around the p-type diffusion regions 45 in a self-alignment manner.

Subsequently, p-type epitaxial layers 60 having a carrier concentration p2 are selectively formed in the trenches 58. Hereinbelow, similar to the above-described embodiments, according to a well-known power MOS transistor manufacturing method, a semiconductor device 10 including a power MOS transistor having narrow elongate semiconductor pillar layers 12 to 14, in which the upper regions 16 have a higher carrier concentration than that of the lower regions 15, is completed.

Note that in this method for manufacturing a semiconductor device according to the fifth embodiment, the lower regions of the first to third semiconductor pillar layers may be formed by repeating forming an epitaxial layers and implanting impurity ions by a required number, like the second embodiment. It should be noted that the embodiments of the invention have been described above though the present invention is not limited to these embodiments. Rather, various modifications and additions can be devised without departing from the sprit and scope of the invention. For example, although in the above embodiments, planar type MOS transistors are explained as an example, the present invention is applicable to other semiconductor devices having MOS or MIS gate, such as trench gate type MOS transistors. Further, the present invention is also applicable not only to MOS transistors but also to other semiconductor devices having a Super-Junction structure, such as IGBTs, Schottky barrier diodes, or the like.

What is claimed is:

1. A semiconductor device, comprising:
   a semiconductor substrate of a first conductivity type;
   a first semiconductor pillar layer of said first conductivity type formed on a main surface of said semiconductor substrate;
   a second semiconductor pillar layer of a second conductivity type formed adjacent to said first semiconductor pillar layer;
   a third semiconductor pillar layer of said first conductivity type formed adjacent to said second semiconductor pillar layer; and
   an insulated-gate type semiconductor element provided in a semiconductor base layer of said second conductivity type formed in a main surface of said second semiconductor pillar layer,
   wherein a carrier concentration on the side of a main surface of each of said first through third semiconductor pillar layers is higher than a carrier concentration on the opposite side of said main surface in each of said first through third semiconductor pillar layers.

2. The semiconductor device according to claim 1, wherein relative to an average X of said carrier concentrations in each of said first through third semiconductor pillar layers, said carrier concentration in each of said first through third semiconductor pillar layers on the side of said main surface has a value of Y that satisfies $1.0<Y/X\leqq 1.2$, and said carrier concentration in each of said first through third semiconductor pillar layers on the opposite side of said main surface has a value of Z that satisfies $0.8\leqq Z/X<1.0$.

3. The semiconductor device according to claim 1, wherein each lower region of said first through third semiconductor pillar layers is formed by repeating forming a first semiconductor layer of said first conductivity type above said main surface of said semiconductor substrate and selectively implanting an impurity of said second conductivity type into a certain region in said first semiconductor layer, and heating to connect impurity-diffused regions of said second conductivity type vertically with each other.

4. The semiconductor device according to claim 3, wherein each upper region of said first through third semiconductor pillar layers is formed by forming on said first semiconductor layer a second semiconductor layer of said first conductivity type having a higher carrier concentration than that of said first semiconductor layer, forming a trench reaching said first semiconductor layer in said second semiconductor layer above impurity-diffused regions of said second conductivity type, and thereafter burying in said trench a epitaxial semiconductor layer of said second conductivity type having a higher carrier concentration than that of said impurity-diffused region of said second conductivity type.

5. The semiconductor device according to claim 3,
wherein each upper region of said first through third semiconductor pillar layers is formed by forming a second semiconductor layer on said first semiconductor layer, forming a plurality of trenches reaching said first semiconductor layer in said second semiconductor layer so that the regions where impurities of said second conductivity type are selectively implanted are positioned at approximately intermediate positions between said plurality of trenches, implanting an impurity of said first conductivity type and an impurity of said second conductivity type having a larger diffusion coefficient than that of said impurity of said first conductivity type from sides of said trenches, and thereafter heating.

6. The semiconductor device according to claim 5, further comprising an insulator film buried in said trenches.

7. The semiconductor device according to claim 1,
wherein each lower region of said first through third semiconductor pillar layers is formed by forming on said main surface of said semiconductor substrate a first semiconductor layer of said first conductivity type, forming a trench in said first semiconductor layer, and burying in said trench a lower epitaxial semiconductor layer of said second conductivity type,
and wherein each upper region of said first through third semiconductor pillar layers is formed by forming on said first semiconductor layer a second semiconductor layer of said first conductivity type having higher carrier concentration than that of said first semiconductor layer, forming in said second semiconductor layer a trench reaching said lower epitaxial semiconductor layer, and burying in said trench an upper epitaxial semiconductor layer of said second conductivity type having a higher carrier concentration than that of said lower epitaxial semiconductor layer.

8. The semiconductor device according to claim 1,
wherein each lower region of said first through third semiconductor pillar layers is formed by forming on said main surface of said semiconductor substrate a first semiconductor layer of said first conductivity type, forming a trench in said first semiconductor layer, and burying in said trench a lower epitaxial semiconductor layer of said second conductivity type,
and wherein each upper region of said first through third semiconductor pillar layers is formed by forming on said first semiconductor layer a second semiconductor layer, forming in said second semiconductor layer a plurality of trenches reaching said first semiconductor layer at both sides of said lower regions of said first through third semiconductor pillar layers, implanting an impurity of said first conductivity type and an impurity of said second conductivity type having a larger diffusion coefficient than that of said impurity of said first conductivity type from sides of said trenches, and thereafter heating.

9. The semiconductor device according to claim 1, wherein said insulated-gate type semiconductor element is an insulated-gate field effect transistor.

10. The semiconductor device according to claim 1, wherein a carrier concentration of said semiconductor base layer is higher than that of said second semiconductor pillar layer.

11. The semiconductor device according to claim 1, wherein said first through third semiconductor pillar layers each has a substantially constant carrier concentration in upper region on the side of said main surface, and has a substantially constant carrier concentration in lower region on the opposite side of said main surface.

12. The semiconductor device according to claim 1, wherein said first through third semiconductor pillar layers each has an upper region on the side of said main surface, in which a carrier concentration becomes higher toward the upper direction, and has a lower region on the opposite side of said main surface, in which a carrier concentration becomes higher toward the upper direction.

* * * * *